United States Patent [19]

Oishi

[11] Patent Number: 4,581,718
[45] Date of Patent: Apr. 8, 1986

[54] MOS MEMORY

[75] Inventor: Kanji Oishi, Koganei, Japan

[73] Assignee: Hitachi, Ltd., Tokyo, Japan

[21] Appl. No.: 617,098

[22] Filed: Jun. 4, 1984

[30] Foreign Application Priority Data

Jun. 3, 1983 [JP] Japan ............................... 58-97824

[51] Int. Cl.[4] ............................................. G11C 11/40
[52] U.S. Cl. .................................... 365/189; 365/230
[58] Field of Search ............................. 365/189–191, 365/230, 194, 182, 203

[56] References Cited

U.S. PATENT DOCUMENTS

4,354,232 10/1982 Ryan .................................. 365/189

Primary Examiner—Terrell W. Fears
Attorney, Agent, or Firm—Antonelli, Terry & Wands

[57] ABSTRACT

A pseudo-static type RAM composed of dynamic type memory cells is operated in response to the changes in external address signals. In the RAM of this type, the word line, with which the selection terminals of the memory cells are connected, are selected only for such a remarkably short time period as responds to the abnormally short period for which the external address signals are changed by address skews. If the selection period of the word line is short, the signal level to be rewritten in the memory cells is dropped so that the stored data are substantially broken. In order to prevent this breakage of the stored data, an address buffer is controlled. The reception of the external address signals by the address buffer is prohibited during the time period after the selection of the word line is started and before the rewriting operation of the data in the memory cells is ended.

8 Claims, 11 Drawing Figures

MOS MEMORY

BACKGROUND OF THE INVENTION

1. Field of the Invention

The present invention relates to a memory composed of MOSFETs (i.e., metal-oxide-semiconductor field effect transistors) and, more particularly, to a technique which is effective for a dynamic type RAM (i.e., random access memory) made detective of changes in an address signal for generating a timing signal necessary for the operation of an internal circuit.

2. Description of the Prior Art

I, the Inventor, has conceived a pseudo-static type RAM, which is constructed to detect changes in an address signal for generating a variety of timing signals necessary for the operations of an internal circuit thereof, prior to the present invention. This pseudo-static type RAM has memory cells composed of capacitors for storing data in the form of charges and MOSFETs for address selections and has its peripheral circuits composed of CMOS (i.e., complimentary MOS) static type circuits. This RAM has such external characteristics as can deemed to be identical to those of the static RAM because, in response to the changes in the address signal detected, the various timing signals necessary therefor are generated.

In this case, the following problems are encountered, as has been revealed by my investigations. The changing timings of the individual address signals of plural bits fed to the RAM are caused to possibly fail to be synchronized to one another by the undesired timing discrepancies, which are encountered by a circuit itself such as a CPU (i.e., central processing unit) for generating those address signals, or by the unevenness in the signal delay of the printed circuit board. If the timing discrepancies (e.g., skews) are encountered in the changes in the address signals of plural bits fed to the RAM, there arises a fear that a word line selecting operation may be restarted by an address signal which changes with a delay after the word line selection is started. In case data to be read out from a dynamic type memory cell such as one MOSFET cell, the level of the holded data in the memory cell selected is changed to an insufficient level by the charge sharing which is caused between the capacitor of that memory cell and the capacitor existing in the data line with which the memory cell is connected. In other words, the data holded in the memory cell are substantially broken. As a result, the data at minute levels, which are read out from the memory cell, are amplified to the desired levels by a sense amplifier, as is well known in the art. The data thus amplified are rewritten in the memory cell.

If the word line selecting operations are started many times within a short period of time by the skews of the address signal, the switching of the word lines is executed in response thereto before the data levels being substantially broken by the read-out operation are rewritten in the corresponding memory cell with the status in which the data levels are amplified to the desired levels. This results is a serious problem that the stored data are broken.

SUMMARY OF THE INVENTION

An object of the present invention is to provide a MOS memory which can operate normally without being affected by the changing timing of an address signal.

Another object of the present invention is to provide a MOS memory which can ignore the address skews.

Still another object of the present invention is to provide a pseudo-static type RAM which can operate at a high speed.

A further object of the present invention is to provide a pseudo-static type RAM which has a novel control circuit.

The other objects and novel features of the present invention will become more apparent from the following description taken in conjunction with the accompanying drawings.

A representative of the present invention to be disclosed thereinafter will be briefly described in the following. That is to say, an address buffer is made not to receive an address signal after a word line selecting operation at the latest by being given a gate function.

DESCRIPTION OF THE PREFERRED EMBODIMENT

Figure 1:
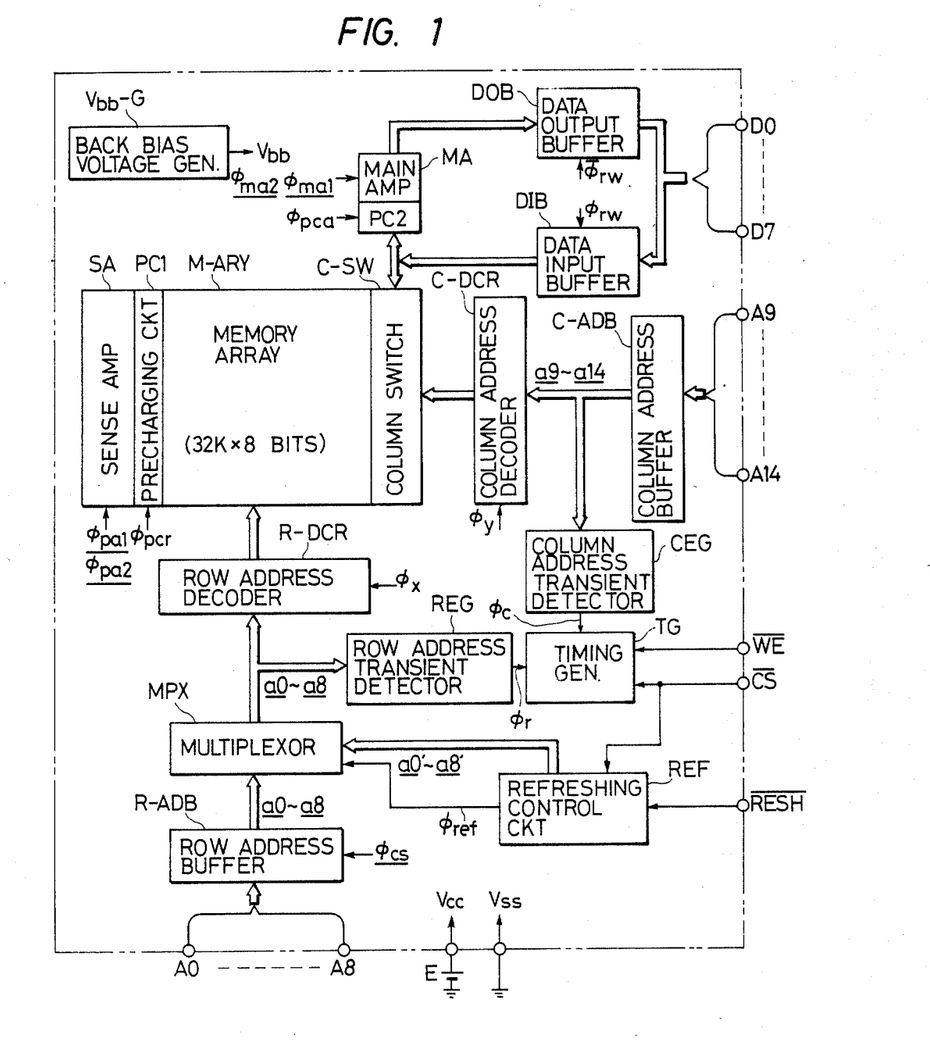
FIG. 1 is a block diagram showing an RAM according to an embodiment of the present invention.

FIG. 1 is a block diagram showing an RAM according to an embodiment of the present invention.

Each circuit block enclosed by two dotted chain lines in FIG. 1 is formed in a single semiconductor substrate of silicon or the like by the technique of fabricating a well-known CMOS (i.e., complimentray MOS) integrated circuit. The RAM is provided with external terminals D0 to D7, A0 to A14, $\overline{WE}$, $\overline{CS}$, $\overline{RESH}$, Vcc and Vss. The external terminals Vcc and Vss are supplied with electric powers from an external power supply E.

Although not limitative, the integrated circuit is formed in a semiconductor substrate of single-crystal P-type silicon. Each of N-channel MOSFETs is constructed of: source and drain regions which are formed in the surface of that semiconductor substrate; and a gate electrode of polysilicon, which is formed on the surface of the semiconductor substrate between the source and drain regions through a relatively thin gate insulationg layer. Each of P-channel MOSFETs is formed in the N-type well region which is formed in the surface of the semiconductor substrate. As a result, the semiconductor substrate forms a substrate gate which is shared with the plural N-channel MOSFETs formed thereon. The N-type region forms the substrate gate of the P-channel MOSFETs which is formed thereon. The substrate gate, i.e., the N-type well region of the P-channel MOSFET is connected with the power supply terminal Vcc of FIG. 1. The common substrate gate, i.e., the semiconductor substrate of the N-channel MOSFET is connected with the output terminal of a back-bias voltage generator Vbb-G so that they are biased to a negative voltage by the latter.

Figure 2:
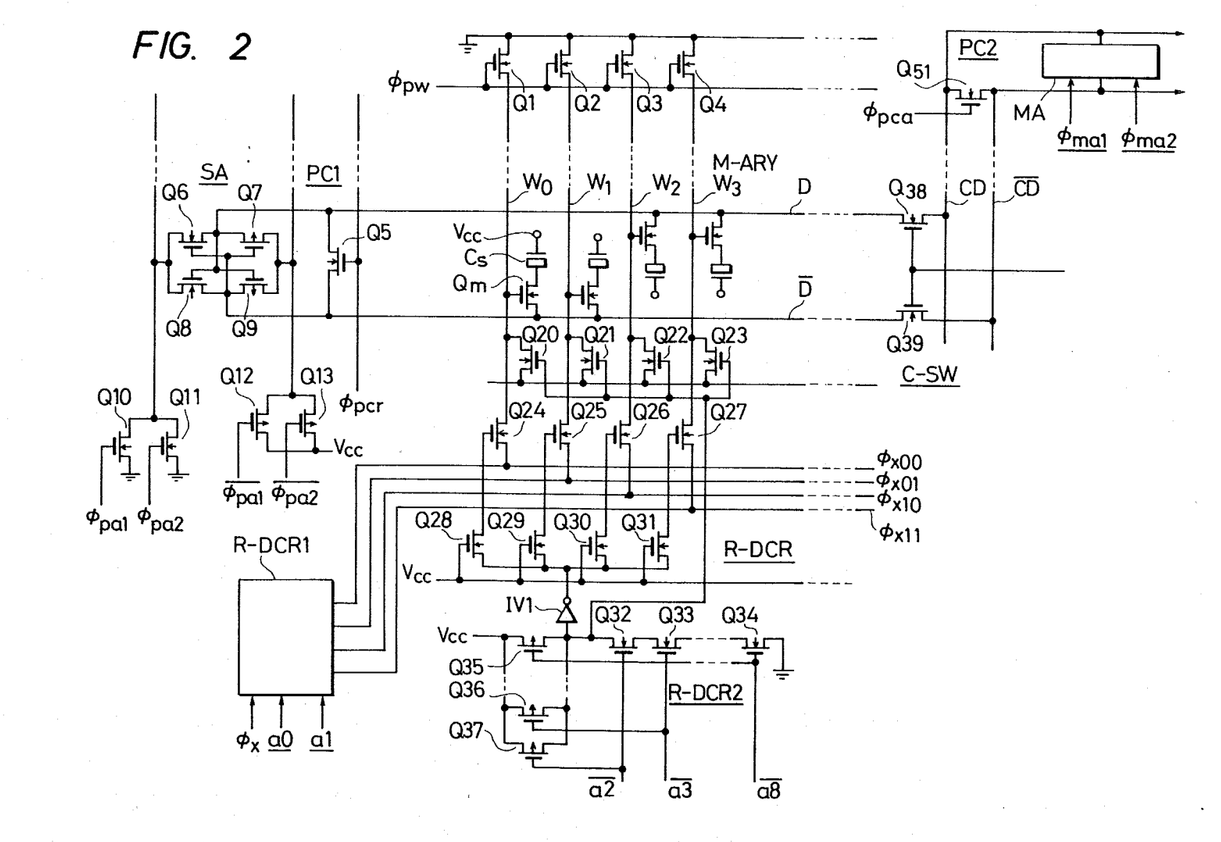
FIG. 2 is a circuit diagram showing a memory cell, a sense amplifier and a row address decoder.

In the RAM of the present embodiment, each of the circuits such as a sense amplifier, precharging circuits, address decoders or a column switch is composed of a plurality of unit circuits. FIG. 2 shows one example of each unit circuit. Therefore, the specific circuits of the individual circuit blocks of FIG. 1 should be referred to FIG. 2.

Indicated by circuit symbol M-ARY in FIG. 1 is a memory array in which memory capacitors and well-known one MOS type memory cells of address selecting MOSFETs are arranged in a matrix form. In the present embodiment, the memory array M-ARY is a folded bit line system, although not limitative thereto. Accordingly, each memory cell has its input and output nodes connected with either of a pair of parallel complimentary data lines D and $\overline{D}$, as shown in FIG. 2.

Indicated by circuit symbol PCL is a precharging circuit which has its unit circuit composed of a precharging MOSFET Q5 which is responsive to precharge pulses $\phi$pcr for short-circuiting the complimentary data lined D and $\overline{D}$, as shown in FIG. 2.

Indicated by circuit symbol SA is a sense amplifier which is constructed of a CMOS (i.e., complimentary MOS) latch circuit having its individual power switch MOSFETs connected between the power supply voltage Vcc and the earth potential Vss of the circuit, although not limitative thereto. The paired input and output nodes of the CMOS latch circuit are connected with the complimentary data lines D and $\overline{D}$. Timing pulses $\phi$pa1, $\overline{\phi}$pa1, $\phi$pa2 and $\overline{\phi}$pa2 are used to control the power switch MOSFETs. The power switch MOSFETs are turned off immediately before the complimentary data lines D and $\overline{D}$ are precharged. As a result, the complimentary data lines D and $\overline{D}$ may latch the Vcc and Vss levels in the floating status. The complimentary data lines D and $\overline{D}$ are short-circuited, when the precharge MOSFETs are turned on, so that they are precharged to an intermediate level of about Vcc/2.

The precharging operation of the memory array of the present embodiment is executed merely by short-circuiting the paired complimentary data lines (likewise common complimentary data lines to be described later). The level change of the complimentary data lines is small when the precharging operation is executed, as compared with the dynamic type RAM of the prior art, in which the voltage is charged up from 0 volt to the level Vcc. The precharge MOSFETs are turned conductive in a sufficient unsaturated state even their gate voltages are set at the usual logic level (i.e., Vcc). As a result, the precharging operation can be conducted at a high speed and with a low power consumption.

Since the precharge level is set at the intermediate level of about Vcc/2, as in the above, the switch MOSFETs of the memory cell are rendered conductive in the sufficient unsaturated state even if their gate voltages (i.e., the word line selection voltages) are set at the usual logic level (i.e., Vcc). As is different from the dynamic type RAM of the prior art, therefore, all the charges can be read out from the data storage capacitors without using any bootstrap voltage.

The read-out reference voltage required for operating the sense amplifier SA makes use of the precharge level on one data line through which the memory cell is not selected. As is different from the dynamic type RAM of the prior art, therefore, no dummy cell for generating the read-out reference voltage may be required.

Incidentally, the timing signals $\phi$pa1 and $\overline{\phi}$pa1 are complimentary to each other, and the timing signals $\phi$pa2 and $\overline{\phi}$pa2 are also complimentary to each other. In order to facilitate the illustrations, the timing signals $\phi$pa1 and $\overline{\phi}$pa1 are indicated together as $\phi$pa1, and the timing signals $\phi$pa2 and $\overline{\phi}$pa2 are also indicated together as $\phi$pa2.

Indicated by circuit symbol C-SW is a column switch which is adapted to be controlled by a column selection signal generated by a column address decoder C-DCR. In response to the column selection signal, the column switch C-SW connects the complimentary data lines to be selected with the common complimentary data line.

Indicated by circuit symbol R-ADB is a row address buffer which receives external address signals of 9 bits through the external terminals A0 to A8 to thereby generate internal complimentary address signals a0 to a8 and $\overline{a}$0 to $\overline{a}$8. Incidentally, the paired internal complimentary address signals, e.g., a0 and $\overline{a}$0 will be indicated by a0 in the following description and drawings. As a result, the internal complimentary address signals a0 to a8 and $\overline{a}$0 to $\overline{a}$8 are indicated as the internal complimentary address signals a0 to a8. The row address buffer R-ADB is so constructed as to conduct two kinds of operations, i.e., to transmit, hold or latch the signals, as will be explained in detail in the following. The control of the row address buffer R-ADB is conducted in response to control signals $\phi$cs and $\overline{\phi}$cs.

Indicated by circuit symbol C-ADB is a column address buffer which is made responsive to external address signals of 6 bits through the external terminals A9 to A14 to generate the internal complimentary address signals a9 to a14 and $\overline{a}$0 to $\overline{a}$14. Incidentally, in accordance with the indications of the internal complimentary address signals, the internal complimentary address signals a9 to a14 and $\overline{a}$9 to $\overline{a}$14 will be expressed as the internal complimentary address signals a9 to a14 in the following drawings and description. The column address buffer C-ADB has its operation controlled by the chip selection signal $\overline{CS}$. Specifically, the column address buffer C-ADB outputs an address signal corresponding to the external address signals if the chip selection signal $\overline{CS}$ is at a low level, and latches the previous address signals if the chip selection signal $\overline{CS}$ is at a high level.

Indicated by circuit symbol R-DCR is a row address decoder which is responsive to the internal complimentary address signals a0 to a8 through a later-described multiplexer MPX to generate the word line selection signals of the memory array M-ARY. The word line selection signals are transmitted to the memory array M-ARY in synchronism with a word line selection timing signal $\phi$x.

The column address decoder C-DCR is responsive to the internal complimentary address signals a9 to a14 to generate the data line selection signal (i.e., the column selection signal) of the memory array M-ARY. This data line selection signal is transmitted to the column switch C-SW in synchronism with a data line selection timing signal $\phi$y.

Indicated by circuit symbol PC2 is a precharging circuit of the common complimentary data line, which is composed of MOSFETs made similar to those of the above precharging circuit PC1 for short-circuiting the common complimentary data line in response to precharge pulses φpcd, although not limitative thereto.

Indicated by circuit symbol MA is a main amplifier which has a circuit structure similar to that of the sense amplifier SA. Timing pulses φma1 and $\overline{\phi ma1}$, and φma2 and $\overline{\phi ma2}$ are used to control the power switch MOSFET of the main amplifier MA. These timing signals φma1 and $\overline{\phi ma1}$ are complimentary to each other, and the timing signals φma2 and $\overline{\phi ma2}$ are complimentary to each other. In FIG. 2, the former timing signals φma1 and $\overline{\phi ma1}$ are indicated together by $\underline{\phi ma1}$, and the latter timing signals φma2 and $\overline{\phi ma2}$ are indicated together by $\underline{\phi ma2}$.

Indicated by circuit symbol DIB is a main input buffer which is responsive to the write timing pulses φrw to transfer the write data from the external terminals D0 to D7 to common complimentary data lines CD and $\overline{CD}$. During the reading operation, that main input buffer DIB is rendered inoperative in response to the write timing pulses φrw.

The above various timing signals are generated by the following individual circuit blocks.

Indicated by circuit symbol REG is a row address transient detector or an edge trigger circuit which is responsive to address signals a0 to a8 (or $\overline{a0}$ to $\overline{a8}$) to detect the leading or trailing edge of the same signals, although not limitative thereto.

Indicated by circuit symbol CEG is a column address transient detector or an edge trigger circuit which is responsive to address signals a9 to a14 (or $\overline{a9}$ to $\overline{a14}$) to detecting the leading or trailing edge of the same signals, although not limitative.

The row address transient detector REG is composed, although not limitative, of exclusive OR circuits which may receive the address signals a0 to a8 and their delayed signals, and OR circuits which may receive the output signals of those exclusive OR circuits. In response to the individual address signals, specifically, there are provided exclusive circuits which may receive the address signals and their delayed signals. In this case, nine exclusive OR circuits are provided to correspond to the fact that the address signals have 9 bits. The output signals of these nine exclusive OR circuits are input to the OR circuits. Accordingly, the row address transient detector or edge trigger circuit REG generates edge detection pulses φr synchronized with the changing timings of those address signals a0 to a8.

The column address transient detector or edge trigger circuit CEG has a structure similar to the row address transient detector REG. Specifically, the column address transient detector CEG is composed of exclusive OR circuits, which may receive the address signals a9 to a14 and their delayed signals, and OR circuits which may receive the output signals of those exclusive OR circuits. The column address transient detector CEG generates, likewise the row address transient detector REG, generates edge detection pulses φc synchronized with the changing timings of those address signals a9 to a14.

Indicated by circuit symbol TG is a timing generator which is operative to generate the above-mentioned major timing signals. Specifically, the timing generator TG generates the above-mentioned serial timing pulses in response to the edge detection pulses φr and φc, the write enable signals $\overline{WE}$ and the chip selection signals $\overline{CS}$.

Figure 4:
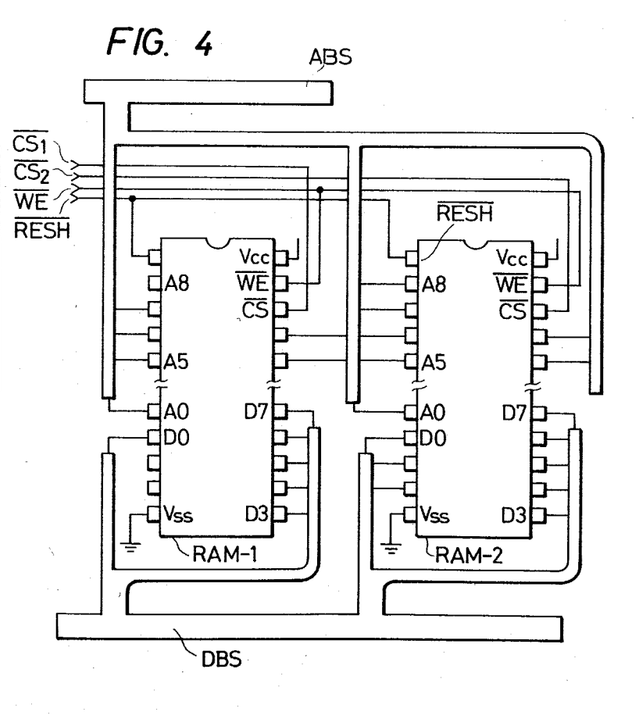

The individual timing pulses, i.e., the timing pulses φpcr, $\underline{\phi pa1}$, $\underline{\phi pa2}$, φx and φcs and the timing pulses φpw fed to word reset MOSFETs Q1 to Q4 of FIG. 4 are deemed as row timing pulses, and the individual timing pulses φpca, $\underline{\phi ma1}$, $\underline{\phi ma2}$, φy, φrw and $\overline{\phi rw}$ are deemed as column timing pulses.

The row timing pulses are outputted each time the row address transient detector REG generates the detection pulses φr despite of the level of the chip selection signals $\overline{CS}$ in order to make the usual access and the automatic refreshing operation of the memory.

On the contrary, the column timing pulses have their outputs controlled by the chip selection signals $\overline{CS}$. If the chip selection signals $\overline{CS}$ are at the high level, i.e., indicate the chip non-selection level, the column timing pulses are not outputted. At this time, the data output buffer DOB and the main input buffer DIB are rendered inoperative. If the chip selection signals $\overline{CS}$ are set at the low level, i.e., at the chip selection level, the column timing pulses are outputted.

The multiplexer MPX is controlled in response to a control signal φref coming from a later-described automatic refresh circuit REF. The multiplexer MPX selectively transmits the internal complimentary address signals a0 to a8 which are generated by the row address buffer R-ADB, and the internal complimentary address signals a0' to a8' which are generated by the automatic refresh circuit REF, to the row address decoder R-DCR.

The substrate-bias voltage generator Vbb-G generates a negative back-bias voltage $V_{BB}$ which is to be fed to the semiconductor substrate, in response to a positive supply voltage as at +5 V, which is applied across the power supply terminal Vcc and the reference potential terminal or earth potential forming the external terminals of the integrated circuit. As a result, the N-channel MOSFET has its substrate gate supplied with the back-bias voltage so that the parasitic capacities between the source and drain and the substrate are reduced to thereby speed up the operation of the circuit.

The automatic refresh circuit REF is composed, although not shown, a timer which is controlled by the refresh control signal $\overline{RESH}$ and chip selection signal $\overline{CS}$ fed through the external terminals, and a refresh address counter for generating internal address signals to be refreshed by counting the output of the timer.

The timer of the automatic refresh circuit REF is started, although not limitative, when the chip selection signal $\overline{CS}$ is caused to take the high level whereas the refresh control signal $\overline{RESH}$ is caused to take the low level. Even if the chip selection signal $\overline{CS}$ is at the low level, the timer of the automatic refresh circuit REF is started in response to the lapse of a period for which the chip selection signal $\overline{CS}$ is at the low level. At this time, the automatic refresh circuit REF switches the multiplexer MPX to output the control signal φref for transmitting the internal address signals from the built-in refresh address counter to the row address decoder R-DCR. As a result that the internal address signals generated by the refresh address counter are fed to the row address decoder R-DCR, the detection pulses φr are outputted from the row address transient detector REG, and the row timing pulses are outputted from the timing generator TG in response to the detection pulses φr. As a result, the memory cell, which is connected with one word line instructed by the refresh address counter, is automatically refreshed.

The timer generates, when the refresh control signal $\overline{RESH}$ is kept at the low level, pulses for executing the refresh operation at a predetermined time interval in response to the drop of the refresh control signal $\overline{RESH}$. The refresh address counter is incremented at the predetermined time interval by the pulses outputted by the timer. As a result, if the refresh control signal $\overline{RESH}$ is held at the low level, the continuous refresh (or self-refresh) operation is executed.

In FIG. 2, each memory cell is composed of an address selecting N-channel MOSFET Qm and a memory capacitor Cs. Each memory cell is arranged each of the nodes of word lines $W_0$ to $W_3$ and the data lines D and $\overline{D}$. Specifically, the MOSFET Qm acting as the seleciton terminal of each memory cell has its gate connected with the corresponding word line, and the MOSFET Qm acting as the input and output terminal of each memory cell has its one electrode connected with the corresponding data line.

The unit circuit of the sense amplifier SA is composed of P-channel MOSFETs Q7 and Q9 and N-channel MOSFETs Q6 and Q8. For the plural unit circuits constructing the sense amplifier SA, there are provided common power switches MOSFETs Q10 to Q13. The MOSFETs Q10 and Q12 are made to have relatively small conductances, when they are turned conductive, by suitably setting the channel width and length. On the contrary, the MOSFETs Q11 and Q13 are made to have relatively large conductances when they are turned conductive.

The MOSFETs Q10 and Q12 have their gates fed in their operating cycle with the complimentary timing pulses $\phi pa1$ and $\overline{\phi}pa1$ for activating the sense amplifier SA, whereas the MOSFETs Q11 and Q13 have their gates fed with the complimentary timing pulses $\phi pa2$ and $\overline{\phi}pa2$ which are delayed from the timing pulses $\phi pa1$ and $\overline{\phi}pa1$. In this way, the operations of the sense amplifier SA are divided into two stages. In the first stage, i.e., when the timing pulses $\phi pa1$ and $\overline{\phi}pa1$ are generated, the sense amplifier SA operates with a weak amplifying operation because the conductances of the MOSFETs Q10 and Q12 are relatively low. In this first stage, the readout voltage of weak level, which is applied from the memory cell to the paired complimentary data lines D and $\overline{D}$, is amplified without any undesirable level fluctuation by the current limiting actions of the MOSFETs Q10 and Q12 having the relatively small conductances. When the second stage is entered, i.e., when the timing pulses $\phi pa2$ and $\overline{\phi}pa2$ are generated after the difference in the complimentary data line potential has been enlarged by the amplifying action of the sense amplifier SA, the MOSFETs Q11 and Q13 having relatively large conductances are responsively rendered conductive. The amplifying action of the sense amplifier SA is accelerated as a result that the MOSFETs Q11 and Q13 become conductive. By causing the sense amplifier SA to conduct its amplifying action in the two stages, the data can be read out at a high speed while preventing the complimentary data lines from having their levels fluctuating in an undesired manner.

The precharging circuit PC1 is constructed of a unit circuit which is composed of the N-channel MOSFET Q5. The power switch MOSFETs Q10 and Q13, which are connected with the sense amplifier SA, are turned off immediately before the precharging operations of the complimentary data lines D and D- are started. The precharging MOSFET Q5 is turned on by the timing pulses $\phi pcr$ which are set at a high level for a predetermined time period after the MOSFETs Q10 to Q13 are turned off.

The row address decoder R-DCR of FIG. 2 is divided, although not limitative, into a first row decoder R-DCR1 and a second row decoder R-DCR2. The second row decoder R-DCR2 is constructed of a plurality of unit circuits corresponding to the four word lines, respectively. In FIG. 2, there are shown the unit circuits which correspond to the word lines $W_0$ to $W_3$.

The unit circuit of the second decoder R-DCR2 is composed, as shown, of a NAND circuit of CMOS structure having N-channel MOSFETs Q21 to 34 and P-channel MOSFETs Q35 to Q37 which may receive the address signals $\overline{a2}$ to $\overline{a8m}$, a CMOS inverter IV1, N-channel cutting MOSFETs Q28 to Q31, and transmission gate MOSFETs Q24 to Q27. The output of the NAND circuit is inverted by the inverter IV1 and is then fed to the gates of the transmission gate MOSFETs Q24 to Q31 through the cutting MOSFETs Q28 to Q31.

The first decoder R-DCR1 is composed, although not specifically shown, of a decoder for decoding the complimentary address signals a0, $\overline{a0}$, a1 and $\overline{a1}$ of two bits, for example, four transmission gate MOSFETs for distributing the word line selection timing signal $\phi_x$, and cutting MOSFETs for transmitting the output of the decoder to the gates of the corresponding transmission gate MOSFETs. As a result, word line selection timing signals $\phi_{x00}$ to $\phi_{x11}$ are outputted from the four transmission gate MOSFETs. Those timing signals $\phi_{x00}$ to $\phi_{x11}$ are alternatively selected to the selected level at the timing determined by the timing signal $\phi x$. This timing signal $\phi x$ has its high level raised to that of the power supply voltage Vcc by making use of the bootstrap capacity, as will become apparent from the following description. The combined circuit of the transmission gate MOSFETs and the cutting MOSFETs of the first decoder R-DCR1 enables the timing signal at such a high level to be transmitted. The timing signals $\phi_{x00}$ to $\phi_{x11}$ are fed to the corresponding word lines through the transmission gate MOSFETs Q24 to Q31 of the second decoder R-DCR2.

The structure of dividing the row address decoder provides the following advantages.

Specifically, the number of the circuit elements of the decoder to be arranged on the semiconductor substrate in correspond to the word lines may be reduced. Accordingly, the pitch of the unit circuits composing the second decoder R-DCR2 may be matched with that of the word lines so that no waste space is formed on the semiconductor substrate.

Between the individual word lines and the grounded point of the circuit, there are provided N-channel MOSFETs Q20 to Q23 which are switched by the output of the NAND circuit. The individual word lines are grounded to the earth through those MOSFETs Q20 to Q23.

Between the individual word lines and the grounded point of the circuit, moreover, there are provided N-channel MOSFETs Q1 to Q4 which are switched by the reset pulses $\phi pw$. These reset pulses are set at a high level immediately before precharging pulses $\phi pcr$ are raised to the high level.

The unit circuit of the column switch C-SW is composed of N-channel MOSFETs which are switched by the output of the address decoder, as shown.

The precharging circuit PC2 is composed of an N-channel MOSFET Q38 which is switched by the precharging pulses $\phi pca$.

The pseudo-static type RAM of FIG. 1 can be operated without any use of the chip selection terminal $\overline{CS}$.

Figure 3:
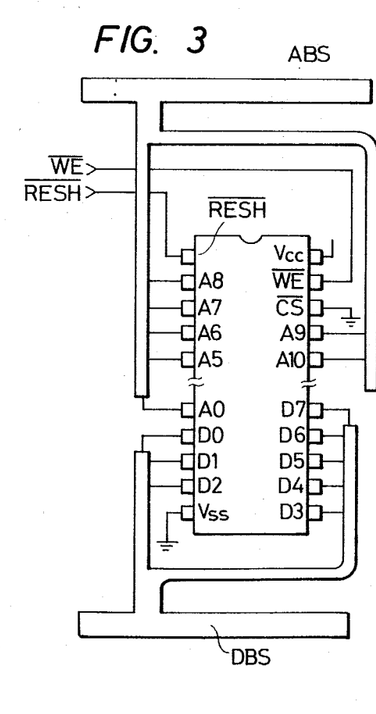
FIGS. 3 and 4 are circuit diagrams showing the RAMs which are actually mounted in printed circuit boards.

FIG. 3 shows the circuit of the RAM in case the chip selection terminal $\overline{CS}$ is fixed at the low level. As shown, the RAM has its address terminals A0 to A14 connected with an address bus line ABS and its data terminals D0 to D8 connected with a data bus line DBS. In this case, the RAM is operated by the changes in the address signals.

FIG. 4 shows the circuit of the two RAMs in case the chip selection terminal $\overline{CS}$ is utilized. In this case, the two RAMs have their address terminals and data terminals commonly connected with the address bus line ABS and the data bus line DBS. Chip selection signals $\overline{CS_1}$ and $\overline{CS_2}$ can be deemed as a kind of address signal. The RAM-1 is selected by the signal $\overline{CS_1}$, and the RAM-2 is selected by the signal $\overline{CS_2}$.

Figure 5:
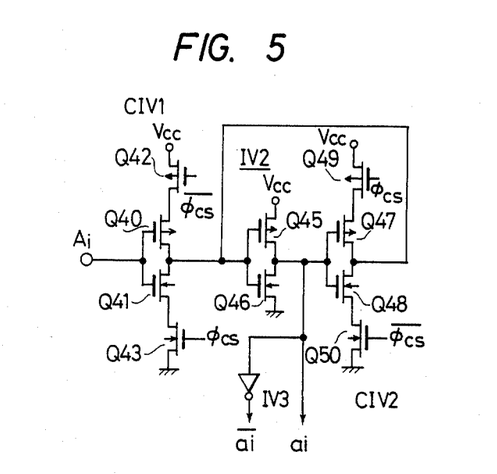
FIG. 5 is a circuit diagram showing an address buffer of FIG. 1.

FIG. 5 shows a specific circuit diagram of the row address buffer R-ADB of FIG. 1. The present embodiment is additionally given the following gate function so as to prevent the stored data from being broken by the address skews.

Specifically, the signal from the external address signal terminal Ai is inputted to the CMOS inverter which is composed of a P-channel MOSFET Q40 and an N-channel MOSFET Q41. Between the two MOSFETs Q40 and Q41 and the power supply terminal Vcc and the grounded point, respectively, there are connected a P-channel MOSFET Q42 and an N-channel MOSFET Q43 which provide power switching means. As a result, the MOSFETs Q40 to Q43 compose substantially one clocked inverter CIV1. The gate function is added by applying the timing signals $\overline{\phi}cs$ and $\phi cs$ to the gates of the MOSFETs Q42 and Q43. Those timing signals $\overline{\phi}_{cs}$ and $\phi cs$ are set at such a level, during the time period after the word line selection is started and before the rewriting operation (i.e., an active restoring operation) is ended, as to close the gate function, although not limitative thereto. In other words, the timing signals $\phi cs$ and $\overline{\phi}cs$ are set at the low (i.e., the earth potential of the circuit) and high (i.e., the power supply voltage Vcc) levels, respectively, so as to render the MOSFETs Q43 and Q42 inconductive. The output signal of the input circuit described in the above is fed to a CMOS inverter IV2 which is composed of a P-channel MOSFET Q45 and an N-channel MOSFET Q46. As a result, a complimentary address signal ai is outputted from the inverter IV2. On the other hand, an inverted address signal $\overline{ai}$ is generated by an inverter IV3 which receives the output of the inverter IV2.

The output of the inverter IV2, which is composed of the MOSFETs Q45 and Q46, is fed back to the input of the inverter IV2 through a clocked inverter CIV2 which is composed of MOSFETs Q47 to Q50 likewise the above-mentioned input circuit. In order to latch the address signals when the input circuit is closed, the MOSFETs Q49 and 50 as the power switch means have their gates fed with the timing signals $\phi cs$ and $\overline{\phi}cs$. As a result, these input circuit and the feedback circuit are brought into the operative states in a complimentary manner.

The summary of the operations of the circuit of the present embodiment will be explained in the following with reference to the timing chart of FIG. 6. Incidentally, the more detailed construction of the timing generator TG and the timings of the various timing pulses will be explained hereinafter with reference to FIGS. 9 to 11.

Figure 6:
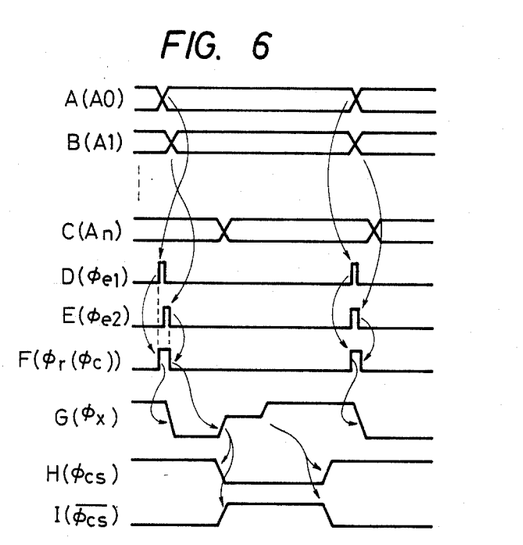
FIGS. 6, 7 and 8 are operating waveform charts of the RAM of FIG. 1.

If the address signals are varied, as shown at A and B in FIG. 6, detection pulses $\phi e1$, $\phi e2$ and so on synchronized with the edges of those signals are generated from the exclusive OR circuits corresponding to those address signals, respectively, as shown at D and E in FIG. 6. The edge detection pulses $\phi r$ ($\phi c$) generated by those logic sums become pulse signals having pulse widthes according to the detection pulses sequentially generated, as shown at F in FIG. 6.

The timing generator TG generates the necessary timing signals in synchronism with the reading and trailing edges of the detection pulses $\phi r$. The word line seleciton timing signal $\phi x$ is set at the low level, as shown at G in FIG. 6, in synchronism with the reading edges of the detection pulses $\phi r$. This word line selection timing signal $\phi x$ is raised to the high level by a predetermined delay circuit which has a time delay according to that of the operation of the circuit such as the address decoder. The word lines are selected in synchronism with the high level of the timing signal $\phi x$. During the time period from the instant when the selecting operation of the word lines is started to the instant immediately after the operation of the sense amplifier SA of FIGS. 1 and 2 is started, the read-out voltage difference between the respective paired complimentary data lines is still at the minute level. If the level of the word lines is returned during that period to the unselected level, the data to be holded in the selected memory cell are substantially broken. The selection during the insufficient period the word lines may be effected as a result that the row address decoder R-DCR responds to the address signal such as an address signal An shown at C in FIG. 6. More specifically, if the changing timing of the address signal An is relatively highly delayed, the row address transient detector REG of FIG. 1 generates the detection pulses $\phi r$ in response to the change of the address signal An. Assuming that there is no protecting function to be described in the following, consequently, the row address decoder R-DCR is operated again by that address signal An.

In accordance with the present embodiment, the gate of the address buffer of FIG. 5 is closed during the period before lapse of a predetermined period after the timing signal $\phi x$ is set at the high level, i.e., during the period after the selection of the word lines is started and before the read-out voltage applied to the complimentary data lines by memory cell selected is amplified to the sufficient level. In other words, the timing pulses $\phi cs$ and $\overline{\phi}cs$ are set at the low and high levels, respectively, as shown at H and I in FIG. 6, so that the MOSFETs Q42 and Q43 are rendered inconductive. The internal address signals, which are present before the timing pulses $\phi cs$ and $\overline{\phi}cs$ are set at the low and high levels, respectively, are latched in the address buffers as a result that the MOSFETs Q49 and Q50 of the address buffers are rendered conductive to start the latching operation of the address buffers.

As a result, the stored data of the memory cells, which are being broken by the word line selecting operation, can be prevented from being broken, because the address signal, if any, such as the above-mentioned address signal which will change with the large delay is not received. The stored data of the memory cells, which are being broken by the word line selecting operation, are caused to restore their levels by the rewriting operation (i.e., the active restoring operation) which is conducted when the word line selection timing signal $\phi x$ is raised to the high level by the boostrapping operation. In other words, the same data are rewritten in the same memory cell.

At the end of the rewriting operation, the timing signal φcs is set at the high level, whereas the timing signal φcs is set at the low level. As a result, the address signal of a subsequent operation cycle can be fetched.

Incidentally, although not limitative, the timing signal φcs is broken in synchronism with the rise of the timing signal φx and is broken in synchronism with the fact that the timing signal φx is set at the high level by the bootstrap effect.

According to the present embodiment, the row address buffer R-ADB is so controlled as to conduct the latching operation during the chip-unselected period. As a result, the timing pulses φcs are set at the low level in response to the fact that the chip selection signal $\overline{CS}$ is set at the high level and is set at the high level in response to the fact that the chip selection signal $\overline{CS}$ is set at the low level, as indicated at D in FIG. 7. The external address signal is fetched to the row address buffer when the chip selection is started. As a result that the output of the row address buffer is changed, the row address transient detector REG generates such detection pulses as are shown at C in FIG. 7. Thus, the RAM of the present embodiment also responds to the external address signal which has its status set during the chip-unselected period.

Figure 7:
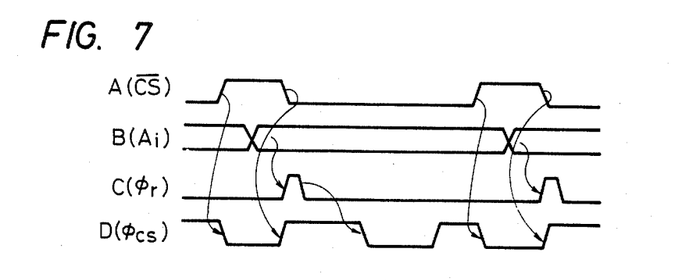

This control method is effective in reducing the power consumption of the RAM because it prevents the unnecessary operation of the row address buffer during the chip-unselected period.

Figure 8:
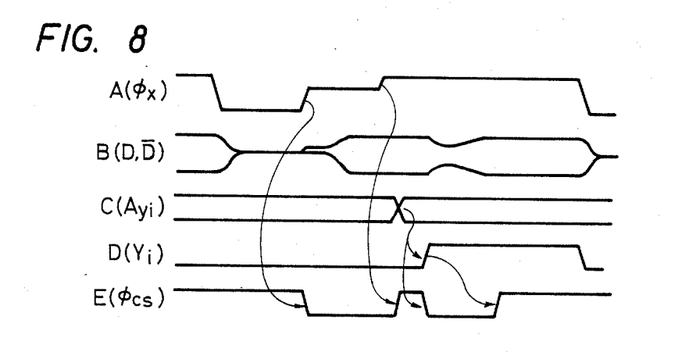

According to the present embodiment, although not limitative, the latching operation of the row address buffer is related to the operation of the column circuit such as the column switch C-SW so as to prevent the deterioration of the data signal which is to be rewritten in the memory cells.

More specifically, when at least one of the column address signals A9 to A14 to be fed to the RAM of FIG. 1 is changed as shown at C in FIG. 8, a column selection signal yi shown at D in FIG. 8 is outputted in response thereto from a column address decoder C-DEC of FIG. 1. In response to the column selection sygnal yi, the column switch C-SW connects one of the plural pairs of the complimentary data lines with the common complimentary data lines CD and $\overline{CD}$. Here, immediately before the column switch C-SW is operated, the common complimentary data lines CD and $\overline{CD}$ are set at the precharge level of about Vcc/2. The common complimentary data lines CD and $\overline{CD}$ have the parasitic capacities which cannot be ignored. When the column switch C-SW is operated, a charge distribution takes place between the complimentary data lines and the common complimentary data lines CD and $\overline{CD}$. As a result, the level difference between the complimentary data lines, which has been amplified in advance to the sufficient level by the sense amplifier, is temporarily reduced, as shown at B in FIG. 8, when the column switch C-SW is operated. The level difference between the complimentary data lines is restored to a predetermined level by the succeeding operation of the sense amplifier SA.

Here, if the selecting operation of the word lines is executed during the level dropping period of the complimentary data lines by the change of the row address signals A0 to A8, the rewriting level for the memory cells becomes insufficient.

In the present embodiment, therefore, the timing pulses φcs for controlling the row address buffer R-ADB are set at the low level, as shown at E in FIG. 8, in synchronism with the period for which the level difference between the complimentary data lines is reduced, namely, during a predetermined time period after the column selection signal yi is generated.

Figure 9:
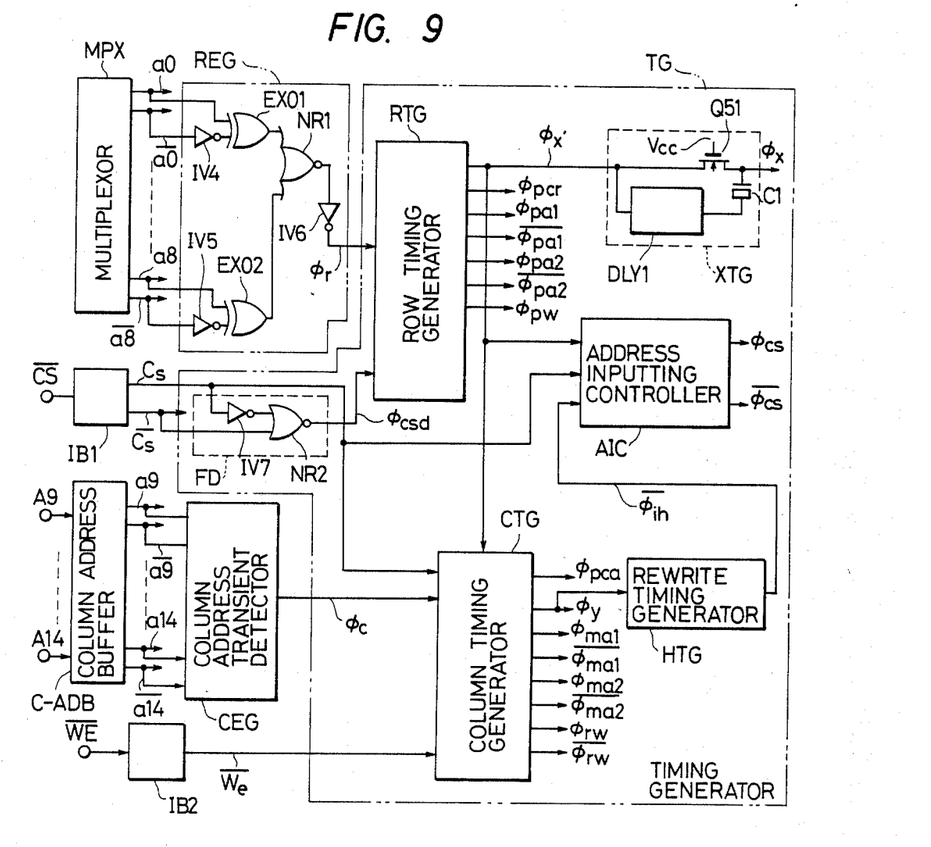
FIG. 9 is a block diagram showing a timing generator of the RAM of FIG. 1.

FIG. 9 is a block diagram showing the edge trigger circuit (i.e., the row address transient detector) REG and the timing generator TG.

The row address transient detector REG is constructed of exclusive OR circuits EX01 to EX02 corresponding one-to-one to the address terminals A0 to A8, as shown, CMOS Inverters IV4 and IV5 acting as delay circuits, a CMOS NOR circuit NR1 responsive to the outputs of the exclusive OR circuits EX01 and EX02, and a CMOS inverter IV6. With the structure shown, when at least one of the address signals a0 to $\overline{a8}$ of 9 bits fed from the multiplexer MPX is changed, the row address transient detector REG outputs the detection pulses φr shown at C in FIG. 11 in response to that change.

The timing generator TG is composed, although not limitative, of a row timing generator RTG for generating the row timing pulses, a column timing generator CTG for generating the column timing pulses, a fall detector for detecting the fall of the chip selection signal $\overline{CS}$, a timing generator XTG for generating the word line selection timing signal φx in response to a timing signal φx', an address inputting controller AIC, and a rewrite timing generator HTG. The fall detector FD of the timing generator TG is composed, as shown, of a CMOS inverter IV7 acting as a delay circuit for receiving the output of an input buffer IB1, and a NOR circuit NR2. The detection pulses φcsd outputted from the fall detector FD are kept at the high level during a predetermined period in response to the fact that the chip selection signal $\overline{CS}$ is changed from the high level to the low level, i.e., that the chip selection is started.

The row timing generator RTG is substantially operated by the OR signal which is generated by the logical sum of the detection pulses φr of the row address transient detector REG and the detection pulses φcs of the fall detector FD. The row timing generator RTG may have a structure similar to the timing generator of the dynamic type RAM, which is started by the row address strobe signal.

The timing pulses φpw, which are outputted from the row timing generator RTG, are raised to the high level when the OR signal of the pulses φr and φcsd is outputted, so that the word line resetting MOSFETs Q1 to Q4 shown in FIG. 2 may be rendered conductive during a predetermined time period after the output. The resetting of the word lines for preparing the word line selection is executed in response to the timing pulses φpw.

The timing pulses φpcr are set at the high level at the timing, which is slightly delayed from the timing pulses φpw, and is set at the low level at substantially the same timing as that at which the timing pulses φpw are set at the low level.

The timing pulses φx' are set at the low level at substantially the same timing as that at which the timing pulses φpw are set at the high level. The timing pulses φx' are set at the high level, as shown at D in FIG. 11, after lapse of a predetermined period from the instant when the OR signal is changed to the low level.

The timing pulses φpa1 and φpa2 are set, as has been described hereinbefore, at the low level at such a timing as slightly precedes the timing at which the timing pulses φpcr are set at the high level, and are set at the high level after the timing pulses φx' are set at the high level. The timing pulses φpa1 and $\overline{φpa2}$ have their phases inverted from the timing pulses φpa1 and φpa2, respectively. The changing timings of the timing pulses φpa2 and $\overline{\phi pa2}$ to the high and low levels are slightly delayed from the changing timings of the timing pulses φpa1 and φpa2, as has been described hereinbefore.

The timing generator XTG is composed, although not limitative, of a delay circuit DLY1, a bootstrap capacitor C1, and a cutting MOSFET Q51. Thanks to the shown structure, the timing pulses φx are raised to a high level near the power supply voltage Vcc, when the timing pulses φx' are raised to the high level, and to a high level exceeding the level of the power supply voltage Vcc after the delay time of the delay circuit DLY1.

The column timing generator CTG is operated in response to the detection pulses φc of the column address transient detector CEG, the chip selection signal Cs, the write enable signal $\overline{we}$ fed through an input buffer IB2, and the timing signal φx' outputted from the row timing generator RT. That column timing generator CTG is operated when the chip selection signal $\overline{CS}$ is set at the selection level. When the chip selection signal $\overline{CS}$ is set at the low level so that a new address signal is outputted from the column address buffer ADB and when the external address signals A9 to A14 are changed during the low-level period of the chip selection signal $\overline{CS}$, the detection pulses φc are raised to the high level in response thereto, as shown at F in FIG. 11.

The timing pulses φpca, which are outputted from the column timing generator CTG, are raised to the high level for a predetermined period in synchronism with the change of the timing pulses φx' to the low level when the chip selection signal $\overline{CS}$ is at the selection level. Moreover, the timing pulses φpca are raised to the high level for a predetermined period in response to the fact that the column address signal is changed, i.e., that the detection pulses are outputted from the column address transient detector CEG. As a result, the common complimentary data lines CD and $\overline{CD}$ of FIG. 2 are set at the precharge level. In other words, the preparation for the amplification of the main amplifier MA is executed.

Figure 11:
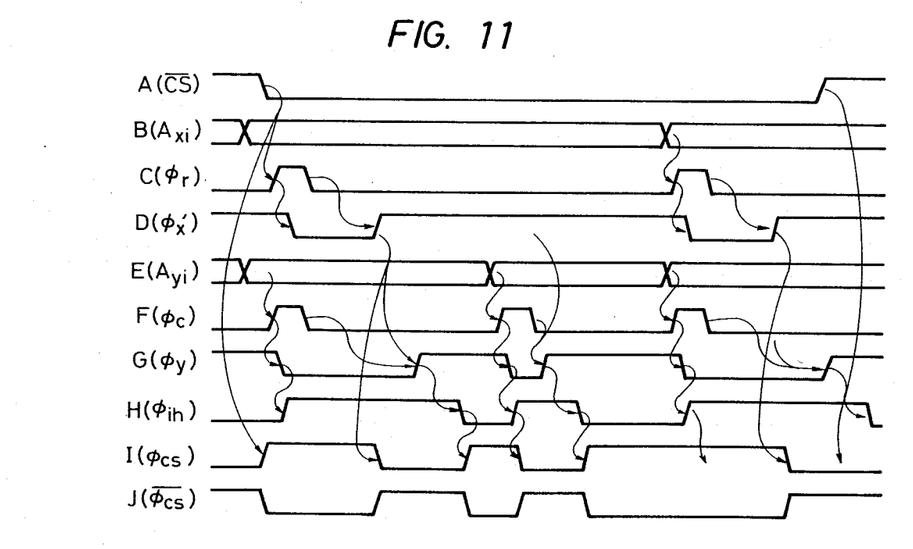
FIG. 11 is a timing chart of the circuit of FIG. 9.

The timing pulses φy are dropped to the low level, as shown at G in FIG. 11, in synchronism with the fact that the detection pulses φc are outputted from the column address transient detector CEG. The changing timing of the timing pulses φy to the high level is basically synchronized with the fall of the detection pulses φc but is also affected by the timing pulses φx'. The timing pulses φy are set at the low level, if the timing pulses φx' are at the low level, and are set at the high level after the timing pulses φx' are raised to the high level. The output of the column address decoder C-DCR is reset as a fact that the timing pulses φy are set at the low level, and has its level determined by the address signals a9 to a14 if the timing pulses φy are set at the high level.

The timing pulses φma1, φma2, $\overline{\phi ma1}$ and $\overline{\phi ma2}$ are set at the low and high levels, respectively, in synchronism with the fact that the timing pulses φpca are set at the high level. Those timing pulses are set at the high and low levels, respectively, after the timing pulses φy are outputted, i.e., after the output level of the column address decoder C-DCR is determined. As a result, the operation of the main amplifier MA is started. Incidentally, the changing timings of the timing pulses φma2 and $\overline{\phi ma2}$ to the high and low levels are delayed from those of the timing pulses φma1 and $\overline{\phi ma1}$.

The timing pulses $\overline{\phi rw}$ are set at the high level if the chip selection signal $\overline{CS}$ is at the selection level and if the write enable signal $\overline{WE}$ is at the high level. In response to this, the data output buffer DOB is rendered operative.

The timing pulses φrw are set at the high level if the chip selection signal $\overline{CS}$ is at the selection level and if the write enable signal $\overline{WE}$ is at the low level. In response to this, the data input buffer DIB is rendered operative.

Figure 10:
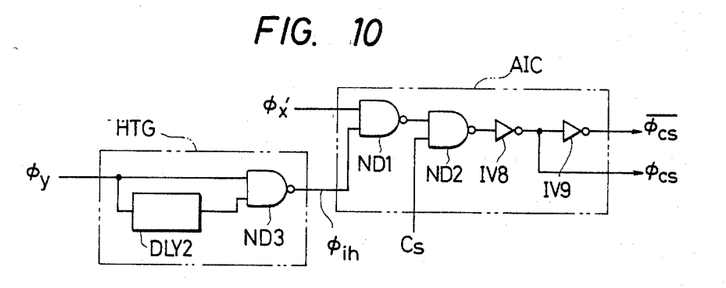
FIG. 10 is a circuit diagram showing circuits AIC and HTG of FIG. 9.

The rewrite timing generator HTG is responsive to the timing pulses φy. The rewrite timing generator HTG is composed, as shown in FIG. 10, of a delay circuit DLY2 and a NAND circuit ND3. The timing pulses φih, which are generated by that generator HTG, are set at a high level, as shown at H in FIG. 11, when the timing pulses φy are set at the low level, and set at the low level when a predetermined period elapses after the timing pulses φy are set at the high level. The delay period after the timing pulses φy are set at the high level and before the timing pulses φih are set at the low level is set, as has been described hereinbefore, in accordance with the period for which the level difference between the complimentary data lines of the memory array is reduced.

The specific circuit of the address inputting controller AIC of FIG. 9 is shown in FIG. 10.

According to the circuit structure shown in FIG. 10, the pulses φcs and $\overline{\phi cs}$ outputted from the address inputting controller AIC are changed at such timings as are shown at I and J in FIG. 11 and as have been described hereinbefore.

The rewrite inputting generator HTG and the address inputting controller AIC of the present embodiment construct together a prohibitor for substantially prohibiting the changes of the word lines.

The following effects can be obtained in accordance with the present invention.

(1) Since the reception of the external address signals is prohibited after the detection pulses φr and φc are generated to start the selection of the word lines, there can be obtained an effect that is possible to prevent the stored data of the memory cells from being broken even with the high address skews.

(2) Since it is made unnecessary by the effect (1) to give the prohibiting function of the special address skews to the circuit for generating the external address signals, there can be obtained an effect that it becomes convenient to handle the circuit for generating the external address signals.

(3) There can be attained an effect that the gate function can be added by the remarkably simple circuit in which the power switch means is attached to the CMOS inverter made receptive of the address signals.

The present invention made by me has been specifically described in connection with the embodiment thereof. However, the present invention should not be limited to the embodiment thus far described, but can naturally be modified in various ways without departing from the scope thereof. For example, the gate function possessed by the address buffer may be realized by a flip-flop circuit, a normal logic circuit or a transmission gate MOSFET. Moreover, the specific circuit structure of the peripheral circuit constructing the pseudo-static type RAM can take a variety of modes of embodiments. Incidentally, the automatic refresh circuit need not always be required.

In the description thus far made, the present invention made by me has been explained in connection with the dynamic type RAM. However, the present invention should not be limited thereto but can likewise be applied an MOS memory, in which the operating timing of the internal circuit can be generated by detecting the changing timing of the address signals, for example, the static type RAM. This static type RAM can expect effects similar to the aforementioned ones, because there arises a fear that the stored data are broken by the double selecting operation of the word lines.

What is claimed is:

1. A MOS memory comprising:
   a plurality of memory cells each having a selection terminal and a data input/output terminal;
   a plurality of word lines connected with the selection terminals of said memory cells, respectively;
   a data line connected with the input/output terminals of said memory cells;
   a detector for detecting the changes in address signals;
   a first timing generator responsive to the output of said detector to generate timing pulses;
   a first selector adapted to have its operation controlled by said timing pulses for selecting the word lines corresponding to said address signals; and
   a prohibitor responsive to one timing pulse, which is outputted from said first timing generator, for prohibiting the levels of said word lines from being changed during the time period within a predetermined period after said timing pulse is generated.

2. A MOS memory according to claim 1, further comprising; a first address buffer for generating an output address signal to be fed to said first selector, wherein said first address buffer has two operating statuses, i.e., a first operating status in which its output address signal instantly responds to the address signal inputted thereto, and a second operating status in which its output address signal does not respond to the address signal inputted thereto but is latched, said second operating status being controlled by the output of said prohibitor,
   whereby the prohibition of the level changes of said word lines is achieved as a result that said first address buffer is brought into said second operating status.

3. A MOS memory according to claim 2, wherein said first address buffer includes a clocked inverter having its operation controlled by the output of said prohibitor, and a flip-flop circuit responsive to the output of said clocked inverter.

4. A MOS memory according to claim 2, wherein each of said memory cells is made of a dynamic type memory cell.

5. A MOS memory according to claim 4, further comprising:
   a plurality of data lines each connected with the input/output terminals of said memory cells;
   a common data line;
   a column switch circuit connecting one of said data lines with said common data line; and
   a second selector for generating a selection signal to be fed to said column switch circuit,
   wherein said prohibitor is adapted to generate the output for prohibiting the level changes of said word lines during a predetermined time period responding to the operation start of said column switch circuit.

6. A MOS memory comprising:
   a plurality of memory cells each having a selection terminal and a data input/output terminal;
   a plurality of word lines connected with the selection terminals of said memory cells, respectively;
   a data line connected with the input/output terminals of said memory cells;
   a selector for selecting one of said word lines in accordance with address signals;
   a detector for detecting the changes of said address signals;
   a timing generator adapted to be operated by the detected output of said detector to generate timing pulses for a predetermined period; and
   an address buffer for generating output address signals to be fed to said selector,
   wherein said address buffer has a first operating status in which its output address signal is changed in response to the address signal inputted thereto, and a second operating status in which its output address does not respond to the address signal inputted thereto but is latched, whereby the operating status is brought to the second one by said timing pulses.

7. A MOS memory comprising:
   a memory array including a plurality of address terminals, a data terminal, a chip selection terminal, and a plurality of memory cells;
   a row circuit responsive to the address signal fed to said address terminals for selecting the row address of said memory array;
   a column circuit responsive to the address signal fed to said address terminals for selecting the column address of said memory array;
   a first detector for detecting the changes in the address signal fed to said row circuit;
   a second detector for detecting the changes in the address signal fed to said column circuit;
   a first timing generator responsive to the output signal of said first detector for generating a timing signal to control the operation of said row circuit; and
   a second timing circuit responsive to the output signal of said second detector, when said chip selection terminal at the selection level, for generating timing pulses to control the operation of said column circuit,
   whereby said MOS memory is made operative when said chip selection terminal is fixed at the selection level.

8. A MOS memory according to claim 7, further comprising a third detector for detecting that the chip selection signal fed to said chip selection signal is at the chip selection level,
   wherein said first timing generator is responsive to the output signals of said first and second detectors.

* * * * *